(12) United States Patent
Chen et al.

(10) Patent No.: US 8,324,713 B2
(45) Date of Patent: *Dec. 4, 2012

(54) PROFILE DESIGN FOR LATERAL-VERTICAL BIPOLAR JUNCTION TRANSISTOR

(75) Inventors: Shuo-Mao Chen, Hsin-Chuang (TW);
Chih-Ping Chao, Hsin-Chu (TW);
Chih-Sheng Chang, Hsin-Chu (TW);
Hua-Chou Tseng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/715,103

(22) Filed: Mar. 1, 2010

(65) Prior Publication Data

US 2010/0213575 A1   Aug. 26, 2010

Related U.S. Application Data

(63) Continuation-in-part of application No. 11/589,478, filed on Oct. 30, 2006, now Pat. No. 7,701,038.

(60) Provisional application No. 61/187,796, filed on Jun. 17, 2009, provisional application No. 60/731,720, filed on Oct. 31, 2005.

(51) Int. Cl.
*H01L 29/735* (2006.01)
*H01L 29/732* (2006.01)

(52) U.S. Cl. ............. 257/593; 257/197; 257/E29.187; 438/170; 438/189; 438/202; 438/203

(58) Field of Classification Search .............. 257/557, 257/558, 593, E29.187
See application file for complete search history.

(56) References Cited

U.S. PATENT DOCUMENTS

| 3,226,613 | A | * | 12/1965 | Haenichen ............ 257/493 |
| 3,895,392 | A | | 7/1975 | Polata et al. |
| 3,987,477 | A | | 10/1976 | Krolik |
| 4,344,081 | A | | 8/1982 | Pao et al. |
| 4,417,265 | A | | 11/1983 | Murkland et al. |
| 4,669,177 | A | | 6/1987 | D'Arrigo et al. |
| 4,672,414 | A | | 6/1987 | Gabriel et al. |
| 4,800,415 | A | | 1/1989 | Simmons et al. |
| 4,831,281 | A | | 5/1989 | Miller |

(Continued)

OTHER PUBLICATIONS

Hashimoto, T., et al., "Direction to Improve SiGe BiCMOS Technology Featuring 200-GHz SiGe HBT and 80-nm Gate CMOS," IEEE, IEDM Tech. Dig., 2003, pp. 5.5.1-5.5.4.

(Continued)

*Primary Examiner* — N Drew Richards
*Assistant Examiner* — John P Dulka
(74) *Attorney, Agent, or Firm* — Slater & Matsil, L.L.P.

(57) ABSTRACT

A lateral-vertical bipolar junction transistor (LVBJT) includes a well region of a first conductivity type over a substrate; a first dielectric over the well region; and a first electrode over the first dielectric. A collector of a second conductivity type opposite the first conductivity type is in the well region and on a first side of the first electrode, and is adjacent the first electrode. An emitter of the second conductivity type is in the well region and on a second side of the first electrode, and is adjacent the first electrode, wherein the second side is opposite the first side. A collector extension region having a lower impurity concentration than the collector adjoins the collector and faces the emitter. The LVBJT does not have any emitter extension region facing the collector and adjoining the emitter.

17 Claims, 13 Drawing Sheets

U.S. PATENT DOCUMENTS

| | | | |
|---|---|---|---|
| 4,951,108 A | | 8/1990 | Leduc |
| 5,416,031 A * | | 5/1995 | Miwa ............................ 438/236 |
| 5,498,885 A | | 3/1996 | Deen et al. |
| 5,514,949 A * | | 5/1996 | Bross et al. .................... 323/315 |
| RE35,442 E * | | 2/1997 | Contiero et al. .............. 257/370 |
| 5,614,424 A * | | 3/1997 | Wong et al. ................... 438/335 |
| 5,717,241 A * | | 2/1998 | Malhi et al. ................... 257/378 |
| 5,717,724 A | | 2/1998 | Yamazaki et al. |
| 6,501,152 B1 * | | 12/2002 | Johnson ......................... 257/558 |
| 7,015,089 B2 | | 3/2006 | Hsu et al. |
| 7,173,320 B1 | | 2/2007 | Rahim |
| 7,701,038 B2 * | | 4/2010 | Chen et al. .................... 257/593 |
| 2002/0096713 A1 | | 7/2002 | Magnee et al. |
| 2003/0062539 A1 | | 4/2003 | Chatterjee |
| 2004/0092070 A1 | | 5/2004 | Hsu et al. |
| 2006/0197185 A1 * | | 9/2006 | Chung ........................... 257/552 |
| 2008/0224266 A1 | | 9/2008 | Chang et al. |
| 2010/0213575 A1 | | 8/2010 | Chen et al. |
| 2010/0219504 A1 | | 9/2010 | Chen et al. |

OTHER PUBLICATIONS

Nii, H., "A Novel Lateral Bipolar Transistor with 67 GHz fmax on Thin-Film SOI for RF Analog Applications," IEEE Transactions on Electron Devices, Jul. 2000, pp. 1536-1541, vol. 47, No. 7.

Olsson, J., et al., "High Current Gain Hybrid Lateral Bipolar Operation of DMOS Transistors," IEEE Transactions on Electron Devices, IEEE Transactions on Electron Devices, Sep. 1995, pp. 1628-1635, vol. 42, No. 9.

Verdonckt-Vandebroek, S., et al., "High Gain Lateral Bipolar Transistor," IEEE, 1988, 4 pages.

Toumazou, F.J., et al., "Analogue IC Design: The Current-Mode Approach," IEEE Circuits and System Series 2, 1990, 3 pages.

Hastings, A., "The Art of Analog Layout," Prentice Hall, 2001, 6 pages.

Cullet, R., "Multicollector Lateral PNP Transistor," IP.com, Prior Art Database, IPCOM000083560D, Jun. 1, 1975, 3 pages.

Aniruddhan, S., et al., "A lateral-BJT-Biased CMOS Voltage-Controlled Oscillator," IEEE, 2004, pp. 976-979.

Kook, Y.J., et al., "P1.10: A New CMOS Pixel with Lateral and Vertical BJT Structure," IEEE, 2002, pp. 162-165.

Gomez, R., et al., "Lateral Bipolar Transistor Fabricated on a Deep-Submicron Technology," IEEE, 1999, pp. 37-42.

Yamada, T., et al., "A Novel High-Performance Lateral BJT on SOI with Metal-Backed Single-Silicon External Base for Low-Power/Low-Cost RF Applications,": IEEE, 1999, pp. 129-132.

* cited by examiner

PROFILE DESIGN FOR LATERAL-VERTICAL BIPOLAR JUNCTION TRANSISTOR

This application claims priority to provisionally filed U.S. patent application Ser. No. 61/187,796, filed Jun. 17, 2009, and entitled "Profile Design for Lateral-Vertical Bipolar Junction Transistor," and is a continuation-in-part of U.S. patent application Ser. No. 11/589,478, filed Oct. 30, 2006, and entitled "High-Gain Vertex Lateral Bipolar Junction Transistor," which application claims priority to provisionally filed U.S. Patent Application Ser. No. 60/731,720, filed Oct. 31, 2005, and entitled "A Novel High-Gain Vertex Lateral-BJT," which applications are hereby incorporated herein by reference.

TECHNICAL FIELD

This invention relates generally to semiconductor devices, and more particularly to the structures and fabrication methods of lateral-vertical bipolar junction transistors.

BACKGROUND

Figure 1A:
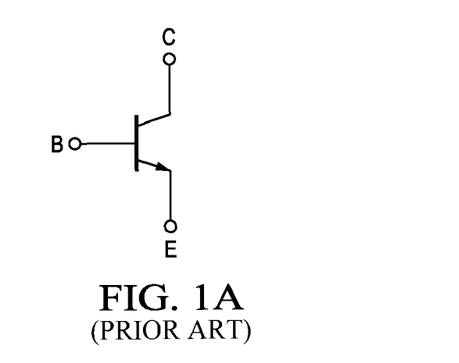
FIG. 1A illustrates a symbol of an NPN transistor.
Figure 1B:
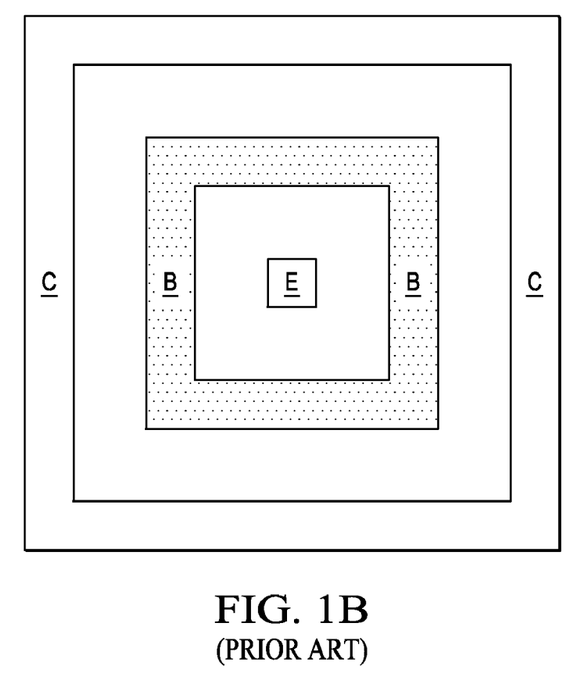
FIGS. 1B and 1C illustrate a conventional vertical bipolar junction transistor (BJT) formed using a conventional CMOS technology.
Figure 1C:
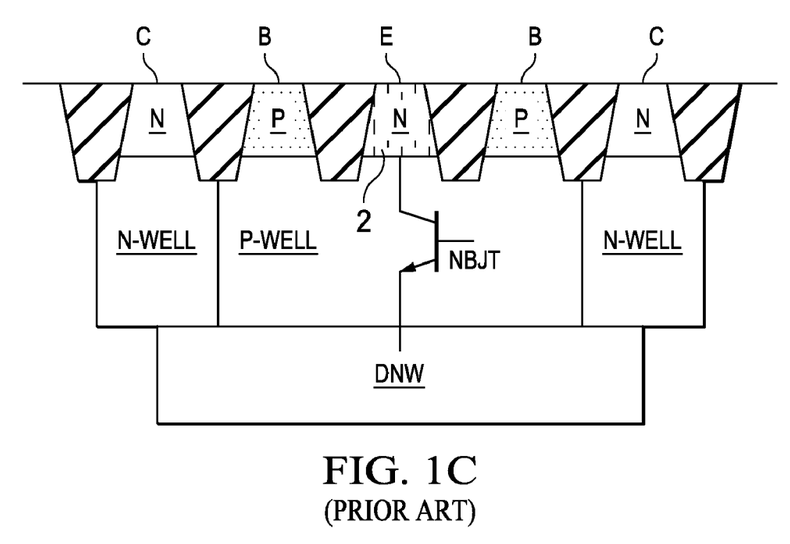

Bipolar junction transistors (BJTs) are key parts of analog integrated circuits. BJTs can be grouped as NPN BJTs (NBJTs) and PNP BJTs (PBJTs). A symbol for an NPN BJT, which comprises collector C, base B, and emitter E, is shown in FIG. 1A. There are two types of commonly designed BJTs using conventional CMOS technology. FIGS. 1B and 1C illustrate a vertical-BJT, wherein a top view is shown in FIG. 1B and a cross-sectional view is shown in FIG. 1C. The vertical-BJT is an NPN transistor comprising doped regions, namely emitter E, base contact B and collector C. To enhance emitter injection efficiency, emitter E is encircled by base contact B and collector C. Emitter E and base contact B are formed in a P-well and collector C is formed in an N-well, wherein the P-well and the N-well are further formed on a deep N-well (DNW). Since the base regions include the P-well and base contact B, the emitter/base junction and the collector/base junction are formed between vertically located components, and the respective BJT is referred to as a vertical BJT.

Figure 1D:
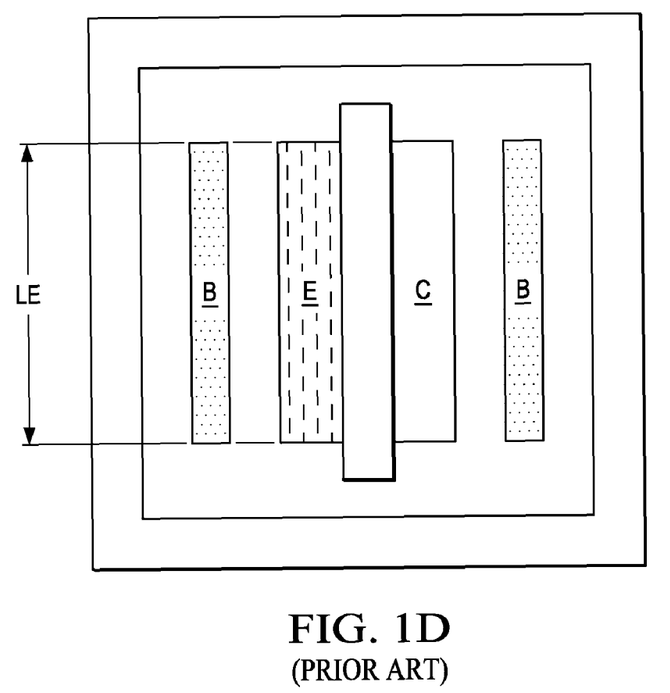
FIGS. 1D and 1E illustrate a conventional lateral bipolar junction transistor (BJT) formed using a conventional CMOS technology.
Figure 1E:
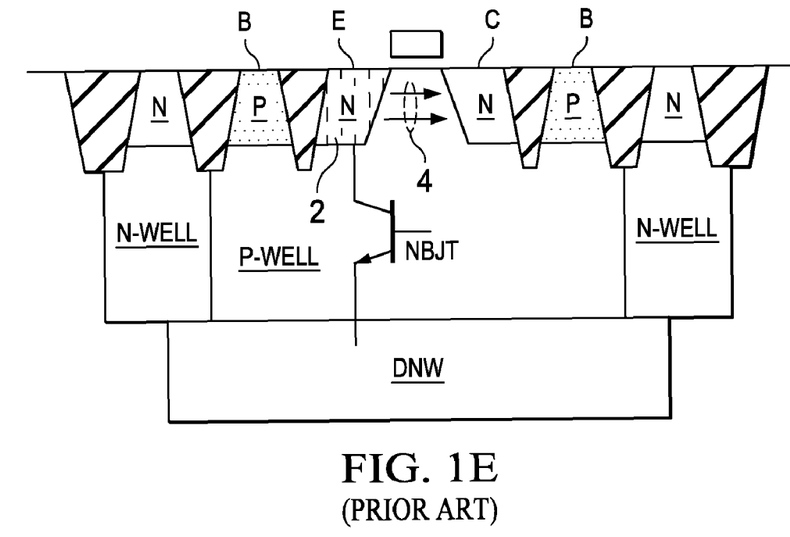

FIGS. 1D and 1E illustrate an (NPN) lateral-BJT. Again, a top view is shown in FIG. 1D and a cross-sectional view is shown in FIG. 1E. Since the P-well, which is part of the base region, has a portion inserted between emitter E and collector C, the emitter/base junction and the collector/base junction are formed between laterally located components, and the respective BJT is referred to as a lateral-BJT (LBJT).

The ability for improving the gain of conventional vertical-BJTs and lateral-BJTs is limited for the following reasons. Using FIG. 1E as an example, besides the intentionally formed BJT, there is also a parasitic transistor NBJT, whose collector, base and emitter are formed by the region E, the P-well and the deep N-well (DNW), respectively. Since a significant portion of the emitter/base junction of the parasitic transistor NBJT is located at interface 2, which is located at the bottom of the emitter E, to reduce the effect of the parasitic transistor NBJT, it is preferred for interface 2 to have a small area. On the other hand, in order to improve the emitter injection efficiency of the lateral-BJT, it is preferred for the path between emitter E and collector C, which is symbolized by arrows 4, to have a big interface area (in the plane vertical to the illustrated plane). This requires the length LE (FIG. 1D) of emitter E and collector C to have a great value. A great length LE and a small area for emitter E are conflicting requirements, which means that the improvement of the lateral-BJT comes with the cost of a greater parasitic BJT. A dilemma for conventional vertical-BJTs is that the base width, which is substantially equal to a depth of the P-well as shown in FIG. 1C, is not scalable, if the vertical-BJTs are formed using a same technology as the formation of CMOS devices.

Conventionally, the BJTs are formed using CMOS technology, and are typically formed simultaneously with the formation of CMOS devices. This incurs drawbacks. CMOS devices often have pocket implants, and thus the same pocket implants were performed on BJTs. The pocket implants result in an increase in the dosage in the base regions, hence a decrease in current gain. Furthermore, the lightly-doped source/drain (LDD) implants cause a gradient dose profile at base/emitter junctions, resulting in lower emitter injection efficiency.

Therefore, there is the need for improving the gain of lateral-BJTs, the scalability of the respective base widths, and the emitter injection efficiency, without the cost of an increase in parasitic effects.

SUMMARY OF THE INVENTION

In accordance with one aspect of the present invention, A lateral-vertical bipolar junction transistor (LVBJT) includes a well region of a first conductivity type over a substrate; a first dielectric over the well region; and a first electrode over the first dielectric. A collector of a second conductivity type opposite the first conductivity type is in the well region and on a first side of the first electrode, and is adjacent to the first electrode. An emitter of the second conductivity type is in the well region and on a second side of the first electrode, and is adjacent to the first electrode, wherein the second side is opposite the first side. A collector extension region having a lower impurity concentration than the collector adjoins the collector and faces the emitter. The LVBJT does not have any emitter extension region facing the collector and adjoining the emitter.

In accordance with another aspect of the present invention, an LVBJT includes a substrate; and a well region of a first conductivity type over the substrate. At least one emitter of a second conductivity type opposite the first conductivity type is in the well region and interconnected to each other. A plurality of collectors of the second conductivity type is in the well region, wherein the plurality of collectors is interconnected to each other. A plurality of base contacts of the first conductivity type is in the well region, wherein the plurality of base contacts is interconnected to each other. A plurality of collector extension regions of the second conductivity type is in the well region and adjoins the plurality of collectors. The plurality of collector extension regions faces the at least one emitter. The LVBJT does not have any emitter extension region adjoining the at least one emitter and facing the plurality of collectors.

The preferred embodiments of the present invention have improved current gain due to small emitter size, which reduces the parasitic effects of vertical-BJTs.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A through 3B illustrate various unit BJT cells;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel design of lateral-vertical bipolar junction transistors (LVBJTs) having improved current gain is provided. The preferred embodiments are illustrated. The variations of the preferred embodiments are then discussed. Throughout the various views and illustrative embodiments of the present invention, like reference numbers are used to designate like elements.

In order to design a high current-gain LVBJT, several principles are preferably applied. The base width, which is the distance in the base region separating an emitter and a collector, is preferably minimized. The emitter size is preferably minimized to lower vertical parasitic transistor effects. The lateral path between the emitter and the collector preferably has a maximized area (meaning the length of the interface region between the emitter and the collector is preferably maximized) in order to enhance emitter injection efficiency. The distance between the emitter and the base is preferably not too big, so that the series base resistance is limited. These principles often conflict with each other, and thus the current gain of the resulting BJT is difficult to improve. A novel design following these principles is provided by the preferred embodiments of the present invention.

Figure 2A:
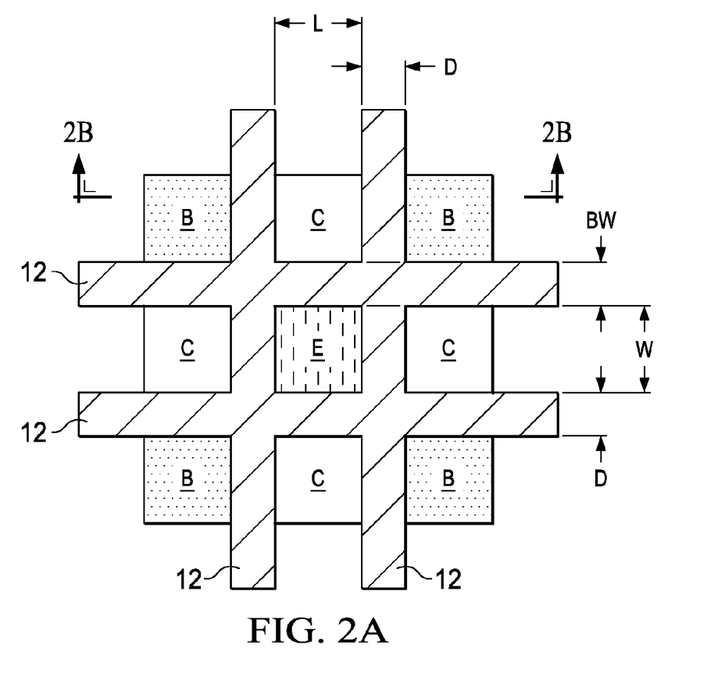
Figure 2B:
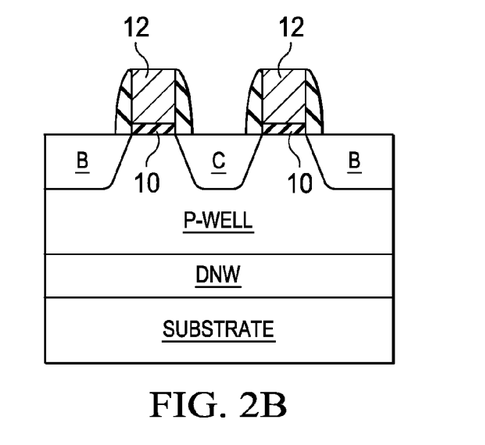

A unit NPN BJT (NBJT) cell is shown in FIG. 2A, which includes collectors C, base contacts B, and emitter E at the center (also referred to as the vertex) of the unit cell. A cross-sectional view of the structure is shown in FIG. 2B, wherein the cross-sectional view is taken along line 2B-2B in FIG. 2A. Preferably, emitter E, collectors C and base contacts B are formed in a P-well, which is in turn on a deep N-well (DNW), and the DNW is further on a p-type substrate. Throughout the description, base contacts B are equally referred to as bases B. One skilled in the art will realize that the base region includes both base contact B and the underlying P-well region (refer to FIG. 2B). A mask is preferably formed on the P-well, separating collectors C, base contacts B and emitter E. The mask preferably includes dielectric layer 10 on the P-well, and polysilicon strip 12 on dielectric layer 10. Polysilicon strip 12 is preferably doped, and a voltage can be applied thereon to change the characteristics of the resulting BJT. One skilled in the art will realize that the so named polysilicon strip 12 may actually be form of polysilicon or other conductive materials. In an embodiment, polysilicon strip 12 is a continuous polysilicon strip extending between different combinations of emitters E, collectors C, and base contacts B. In alternative embodiments, polysilicon strip 12 may include different portions disconnected from each other, with some portions being between emitters E and collectors C, some portions being between collectors C and base contacts B, and some other portions being between emitters E and base contacts B. Accordingly, some portions of polysilicon strip 12 may be electrically floating, while other portions may be applied with certain voltages, as will be discussed in detail in subsequent paragraphs.

Figure 2C:
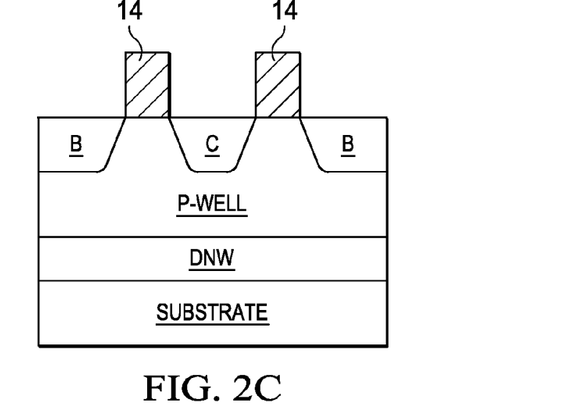

FIG. 2C illustrates a cross-sectional view of a variation of the structure shown in FIG. 2A, wherein a resist protective oxide (RPO) 14 is formed as the mask on the P-well. Although RPO 14 cannot be used for applying a voltage, it is used for isolating the subsequently formed silicide regions on emitter E, collectors C and base contacts B from contacting each other.

Referring back to FIG. 2A, emitter E is located at the vertex of base contacts B. Preferably, the length L and width W of emitter E is small, and more preferably is substantially close to the minimum width allowed by the forming technology of the respective chip, or in other words, substantially close to the critical dimension. Emitter E preferably has the shape of a polygon, such as a triangle, rectangle or hexagon. Collectors C are preferably formed neighboring sides of emitter E. Preferably, no base contact B is formed on neighboring the sides of emitter E. All collectors C are interconnected and act as one collector, and all base contacts B are interconnected and act as one base. Accordingly, the unit cell shown in FIG. 2A acts as one BJT.

With such a design, the previously discussed principles are applied and the current gain of the resulting BJT is improved. Note that the base width BW, which is the spacing between collector C and emitter E, determines the width of bases, and may be scaled to the minimum width. Width D, which is the width of the shaded spacing in FIG. 2A, is preferably small. Emitter E is preferably small because the length L and width W can be reduced to the minimum width. Since all sides of emitter E are adjacent collectors C, the interface between emitter E and collectors C has a length equal to two times length L plus two times width W, and hence the path between emitter E and collectors C has a relatively great area.

Figure 3A:
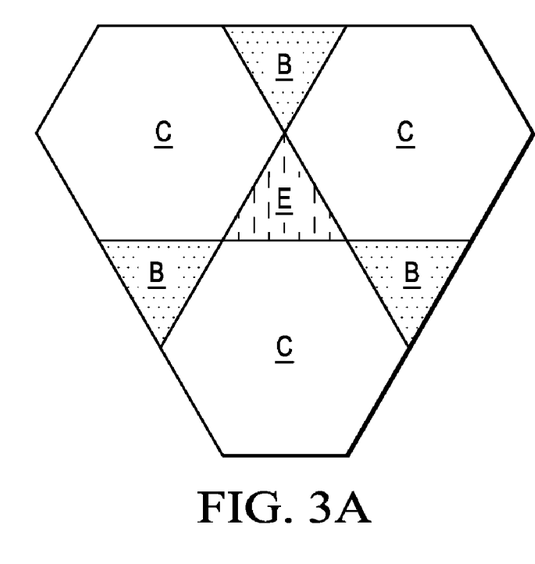
Figure 3B:
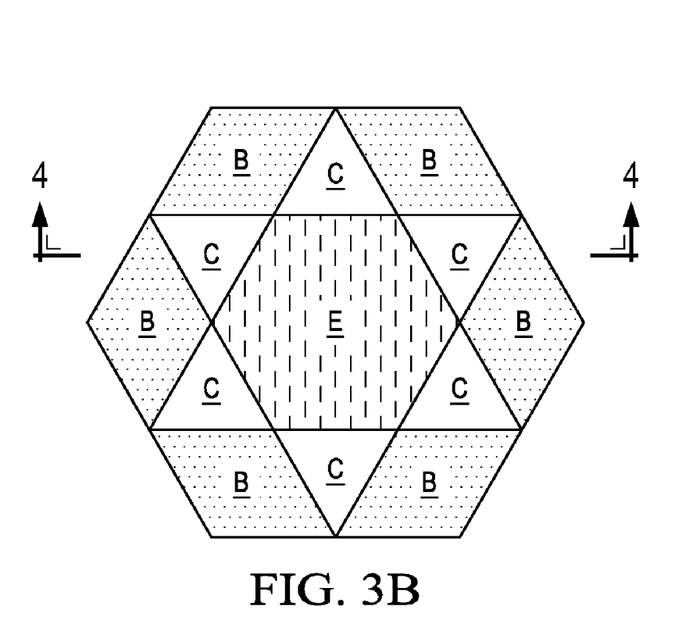
Figure 9:
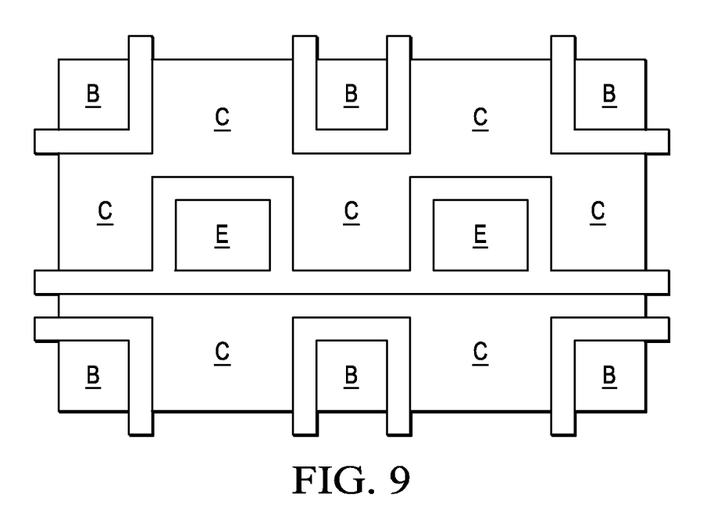
FIG. 9 illustrates a BJT embodiment, wherein emitters are separated from base contacts by collectors.

FIGS. 3A and 3B are variations of the preferred embodiment of the present invention, and these variations have the following common features: emitter E is located at the center of the unit cell; all sides of emitter E are neighbored by the sides of collectors C; bases B are located close to emitter E, but no side of base B is adjacent the sides of emitter E. In the preferred embodiment, no collector C is located between an emitter E and a base B. In other embodiments, as shown in FIG. 9, an emitter E and a base B may be separated by a collector C. For simplicity, polysilicon strips or RPO regions between neighboring emitters, collectors and base contacts are not shown, although they are preferably provided between all the neighboring features E, B and C. It is appreciated that although the emitters, collectors and bases preferably have regular shapes for the convenience of layout, they can have irregular shapes, and the irregularities may include sides with unequal lengths, curved sides, etc.

In FIG. 3A, emitter E is a triangle, and collectors C and base contacts B are hexagons and triangles, respectively. In FIG. 3B, emitter E has a hexagonal shape, while collectors C have triangular shapes, and bases B have diamond shapes. It is to be noted that the preferred embodiments of the present invention do not govern the relationship between the shapes of the emitters, collectors and base contacts, except that the above-discussed design principles are preferably applied.

Figure 4:
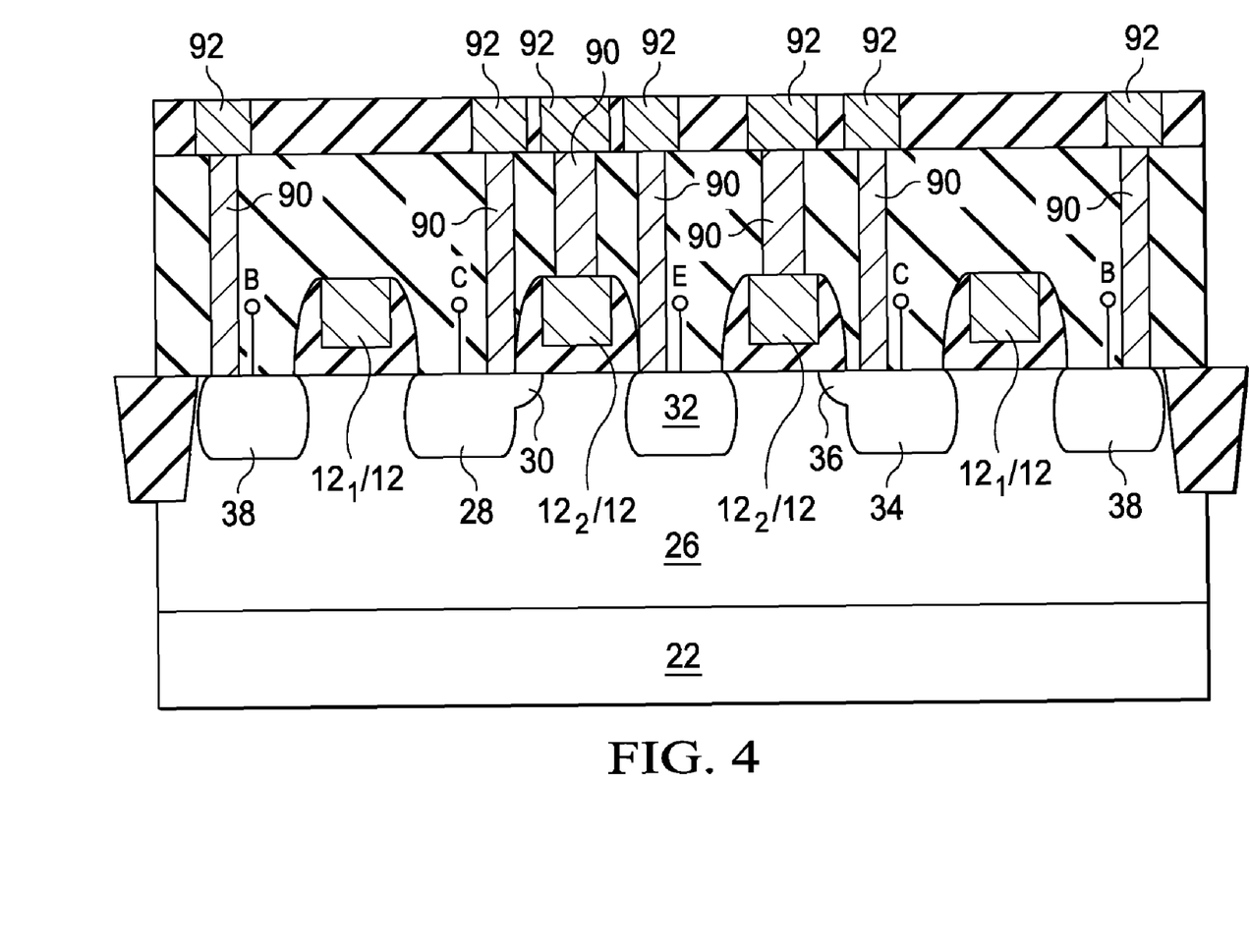
FIGS. 4 through 7 are cross-sectional views of various embodiments of the present invention.

FIG. 4 illustrates a cross-sectional view of a PNP LBJT, wherein the cross-sectional view may be taken along line 4-4 in FIG. 3B. The cross-sectional view may also be obtained from other embodiments of the present invention, such as FIGS. 8A through 9. Substrate 22 preferably comprises a semiconductor material such as silicon or SiGe, and is preferably doped with a p-type impurity, although an n-type substrate can also be used. N-well 26 is formed on substrate 22. The PNP LBJT includes collectors 28 and 34, and emitter 32 therebetween. Collectors 28 and 34 and emitter 32 are doped with p-type impurities. The base region of the BJT includes n-well 26 and base contacts 38, which are doped as n-type.

Emitter 32 and collectors 28 and 34 are preferably formed simultaneously with the formation of P+ source/drain regions of CMOS devices, while base contacts 38 are preferably formed simultaneously with the formation of N+ source/drain regions of CMOS devices. Collectors 28 and 34 preferably further include collector extensions, such as collector extensions 30 and 36, which are preferably similar to lightly-doped source/drain (LDD) regions of CMOS devices. Collector extensions 30 and 36 may be formed simultaneously with the formation of lightly-doped source and drain (LDD) regions in CMOS devices, wherein the CMOS devices may be I/O devices or core devices. Preferably, collector extensions 30 and 36 are formed only on the side of the respective collector facing emitter 32, but not facing base contacts 38. Further, collector extensions 30 and 36 are possibly not formed on any side not facing any emitter. Therefore, only collector extension 30 is formed on one side, while on an opposite side, there is no collector extension formed. Similarly, only collector extension 36 may be formed adjoining collector 34 and on a side facing emitter 32, although it can also be formed on the side facing base contacts 38. Emitter 32 also does not have extension regions. Advantageously, not forming extension regions for emitter 32 may increase the sharpness of the emitter-base junction, so that the emitter injection efficiency is improved.

Furthermore, there is no pocket region formed in base region 26 (n-well 26) adjacent emitter 32 and collectors 28 and 34, wherein pocket regions are regions having an opposite conductivity type than the respective collector extensions. Particularly, contrary to the conventional structures, the BJT embodiment as shown in FIG. 4 does not have any pocket region adjacent emitter 32 and collectors 28 and 34 when the BJT device is a core BJT device. In addition, the BJT embodiment as shown in FIG. 4 does not have any pocket region adjacent emitter 32 and collectors 28 and 34 when the BJT device is an I/O BJT device. There are no pocket regions formed in n-well region 26 and close to base contacts 38.

Figure 5:
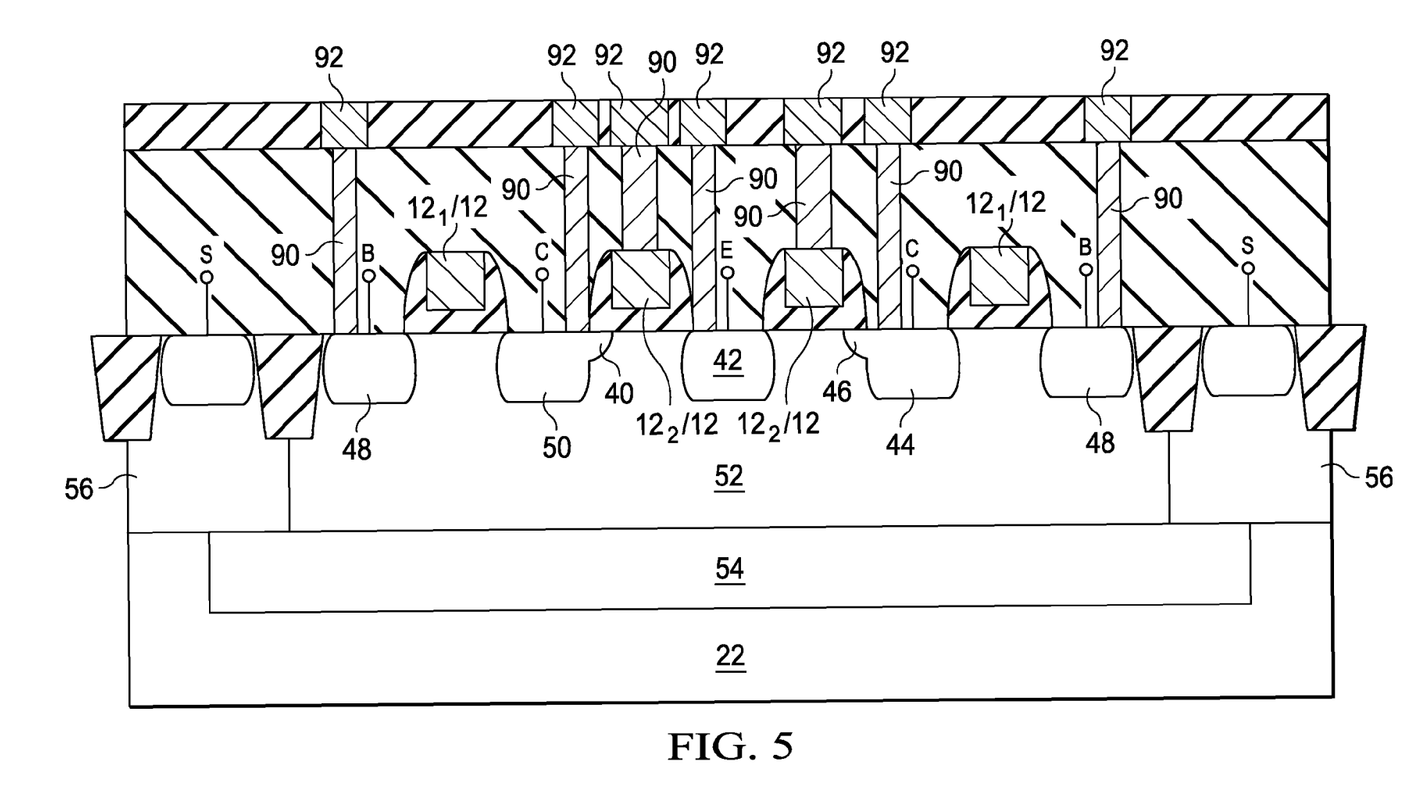

FIG. 5 illustrates a cross-sectional view of an NPN LBJT. The structure of collectors 50 and 44 (and collector extensions 40 and 46), emitter 42, and base contacts 48 are similar to the respective components illustrated in FIG. 4, except the conductivity types of the collectors (and collector extensions), emitter, and base contacts are reversed. The base region includes p-well region 52. Deep n-well (DNW) region 54 and n-wells 56 are formed to isolate the PNP LBJT from the underlying p-type substrate 22. Again, collector extensions 40 and 46 are formed only on the sides of the respective collectors facing emitter 42. There are no pocket regions formed adjacent collector extensions 40 and 46. Emitter 42 also does not have extension regions. Furthermore, there are no pocket regions formed in base region 52 (n-well 52) and adjacent emitter 42. Again, the BJT embodiment as shown in FIG. 5 preferably does not have pocket regions adjacent emitter 42 and collectors 44 and 50 regardless of whether the BJT embodiment is a core BJT device or an I/O BJT device.

Figure 6:
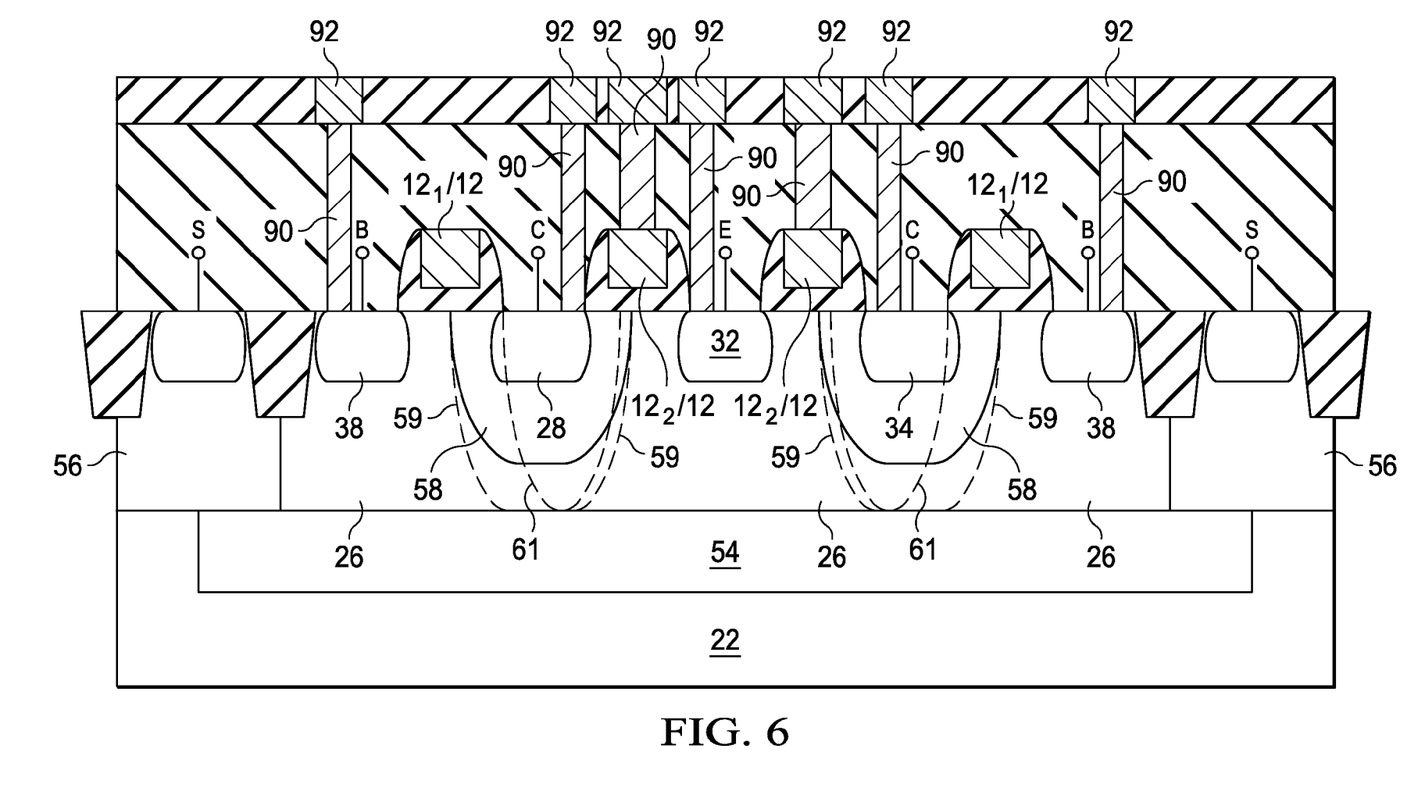

FIG. 6 illustrates a cross-sectional view of an additional PNP LBJT. The structure is similar to the embodiment shown in FIG. 4, except the collector extension regions 30 and 36 are omitted, while p-well regions 58 are formed to enclose collectors 28 and 34. P-well regions 58, which are also referred to as extension regions hereinafter, are lightly doped, so they may act as the extension regions 30 and 36 as shown in FIG. 4. Similarly, deep extension regions 58 are only formed for collectors 28 and 34, but not for emitter 32. In an embodiment, deep extension regions 58 are formed on both sides (sides facing toward and away from emitter 32). In alternative embodiments, as are illustrated using dotted lines 61, deep extension regions 58 are formed only on the side facing emitter 32, but not on the side away from emitter 32. In addition, there are no pocket regions formed adjacent any of collectors 28 and 34, base contacts 38 and emitter 32. P-well regions 58 may be shallower than n-well region 26, or as deep as n-well region 26, but shallower than DNW region 54, as illustrated by dotted lines 59.

Figure 7:
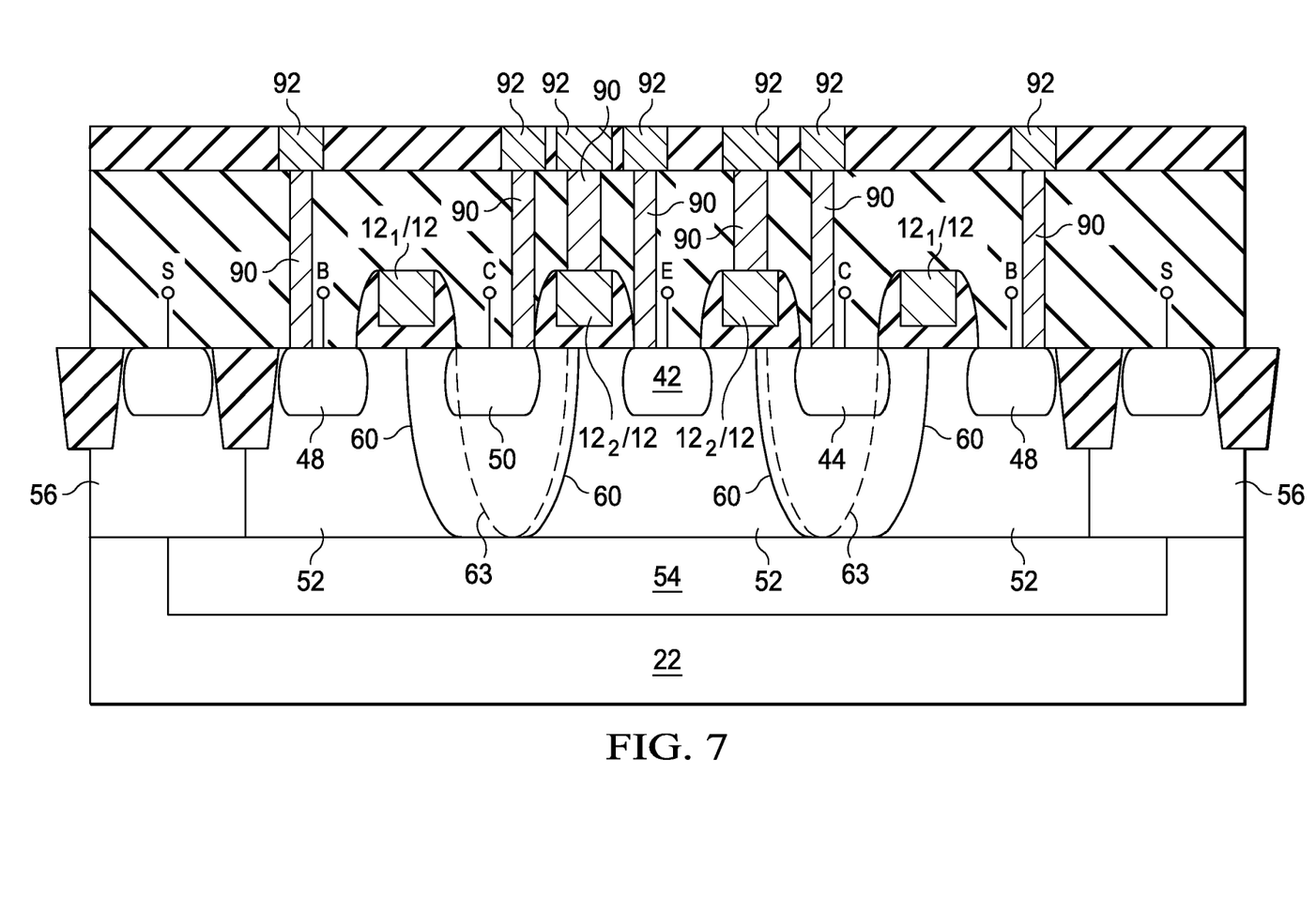

FIG. 7 illustrates a cross-sectional view of an additional NPN LBJT. The structure is similar to the embodiment shown in FIG. 5, except the collector extension regions 40 and 46 are omitted, while n-well regions 60 are formed to enclose collectors 44 and 50. There are preferably no pocket regions formed adjacent any of collectors 44 and 50, base contacts 48 and emitter 42. N-well regions 60, which are also referred to as extension regions hereinafter, are lightly doped, so they may act as the extension regions 40 and 46 as shown in FIG. 5. Similarly, deep extension regions 60 are only formed for collectors 44 and 50, but not for emitter 42. In an embodiment, deep extension regions 60 are formed on both sides (sides facing toward and away from emitter 42). In alternative embodiments, as illustrated using dotted lines 63, deep extension regions 60 are formed only on the sides of collectors 44 and 50 facing emitter 42, but not on the side facing away from emitter 42.

In each of FIGS. 4 through 7, polysilicon strips 12 are formed, which are preferably doped, and a voltage can be applied thereon to tune the performance of the resulting BJT. In an embodiment, a top view (refer to FIG. 2A) shows that polysilicon strips 12 form an interconnected polysilicon net. Alternatively, in the embodiments illustrated in FIGS. 4 through 7, RPO strips may be formed in place of polysilicon strips 12. In this case, a dielectric layer underlying polysilicon strips 12 may be omitted.

In each of FIGS. 4 through 7, polysilicon strips 12 may either be floating or connected to a bias voltage. In the preferred embodiment, polysilicon strips $12_1$, which are between collectors 28/34/44/50 and the respective base contacts 38/48, are preferably floating. Accordingly, polysilicon strips $12_1$ may be disconnected from any other conductive features such as metal lines, contact plugs, and the like. Alternatively, polysilicon strips $12_1$ may be connected to other conductive features, but are still floating and not applied with any bias voltage. Polysilicon strips $12_2$, on the other hand, may either be floating and disconnected from other conductive features, or connected to a bias voltage. FIGS. 4 through 7 illustrate that polysilicon strips $12_2$ are connected to contact plugs 90 and metal lines 92, while polysilicon strips $12_1$ are not connected to (although they may be connected to) any contact plug. In an exemplary embodiment, during the operation of the respective (PNP) BJT devices, polysilicon strips $12_2$ may be connected to a negative voltage. By connecting such a voltage, the emitter-to-collector leakage current can be reduced.

Figure 8A:
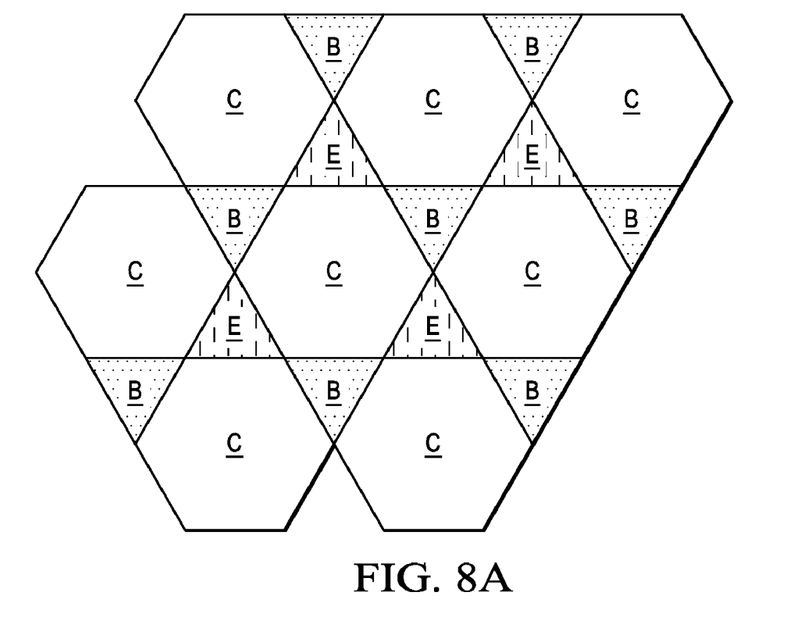
FIGS. 8A through 8C are layouts of array-type BJTs.
Figure 8B:
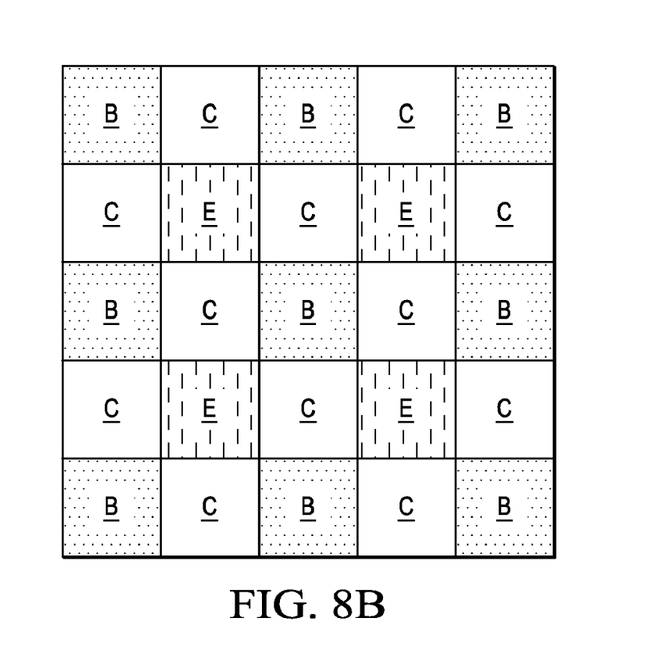
Figure 8C:
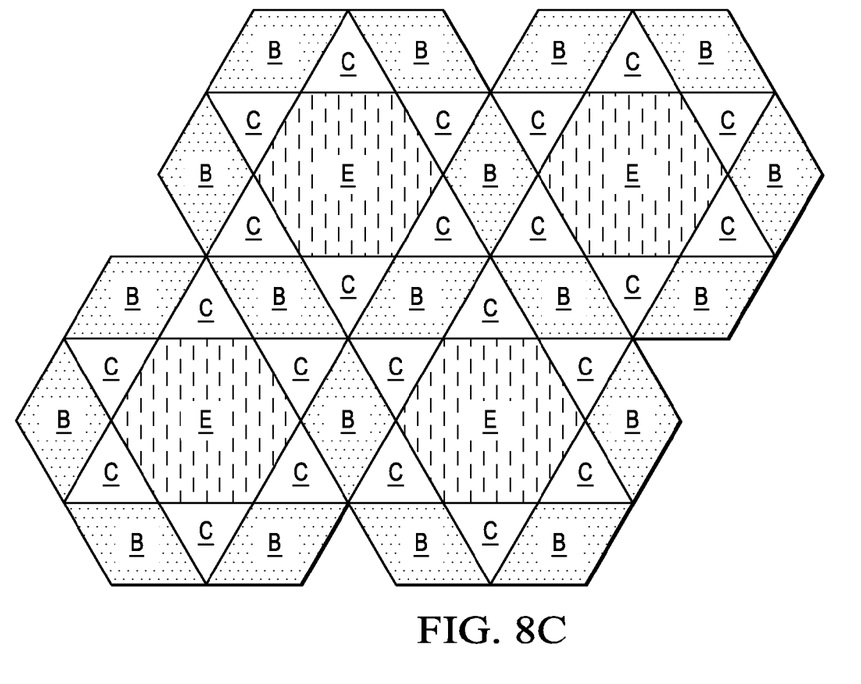

In the preferred embodiment of the present invention, the unit cell of the LBJT is repeatable and can be arranged as an array. FIGS. 8A, 8B and 8C illustrate the layout of 2 by 2 arrays. For simplicity, polysilicon strips 12 separating neighboring collectors, emitters, and base contacts are not shown, although they may be formed. In each of the arrays, since there are four emitters arranged as a 2 by 2 array, the entire structure is considered as an array-type LVBJT, with each emitter and the respective surrounding collectors and bases treated as one unit LVBJT cell. Preferably, all four emitters E are interconnected as one; all of the base contacts B are interconnected as one; and all of the collectors C are interconnected as one. Therefore, the array is equivalent to one LVBJT.

A BJT comprising an array of small BJTs is advantageous over one big BJT. As is commonly known, when one region is divided into sub regions, the total area does not change, while the total perimeter increases. Accordingly, compared to an LVBJT occupying the same chip area but having only one base, one emitter and one collector, the preferred embodiments of the present invention have a maximized total interface area in the path between the collectors and the emitters, while the total chip area occupied by the emitters is not increased. Meanwhile, the emitter/base has a minimized interface area.

Generally, an LBJT may be designed with different numbers of rows and columns according to design requirements. Preferably, in each unit cell of the array, the emitter has a minimized area, which is preferably determined by the minimum width allowed by the forming technology, and the LBJT preferably has more unit cells for improved performance.

FIG. 9 illustrates a variation of the preferred embodiment, wherein each base contact B is separated from emitters E by collectors C. An advantageous feature of this embodiment is that the series base resistance can be adjusted by adjusting the distance between base contact B and emitter E.

Figure 10:
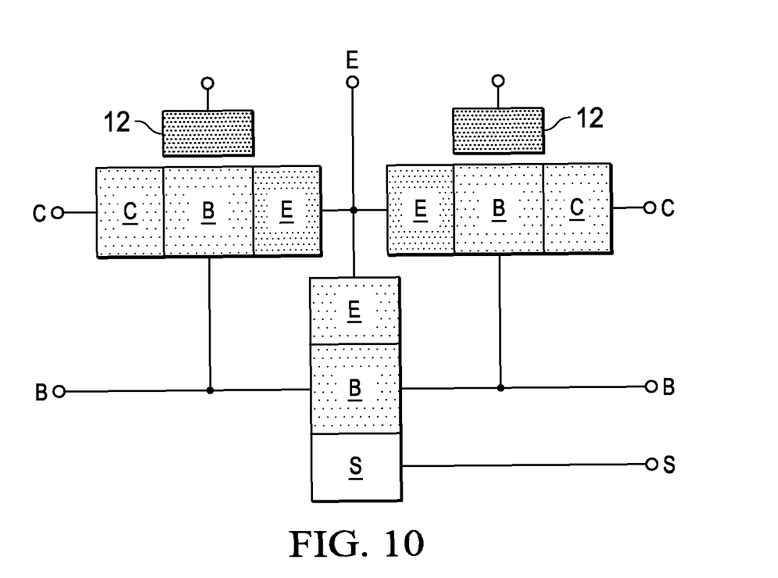
FIG. 10 illustrates the lateral and vertical BJTs as sub-components of a lateral-vertical BJT embodiment.
Figure 11:
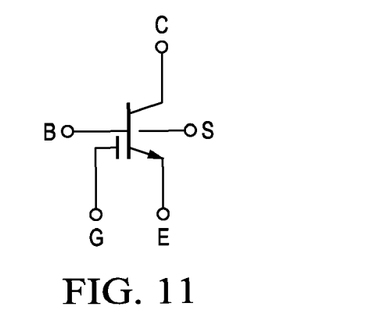
FIG. 11 illustrates a symbol of a lateral-vertical BJT.

FIG. 10 illustrates a diagram showing the vertical and lateral sub BJTs that form the LVBJT. Using the BJT device shown in FIG. 4 as an example, in addition to the lateral BJTs discussed in the preceding paragraphs, a vertical BJT, which includes substrate 22 as collector C and n-well region 26 as base B, is formed. The LVBJT shown in FIG. 4 is thus the combined structure of the lateral BJTs and the vertical BJT. A symbol of the LVBJT is shown in FIG. 11.

Sample LVBJT devices were formed using the preferred embodiment of the present invention, wherein the sample devices have a structure similar to what is shown in FIG. 8B except that the sample devices are in the form of 3 by 3 arrays. The polysilicon width D (refer to FIG. 2A) is about 0.25 μm, the emitter width W is about 0.28 μm, and the emitter length is about 0.4 μm.

Figure 12:
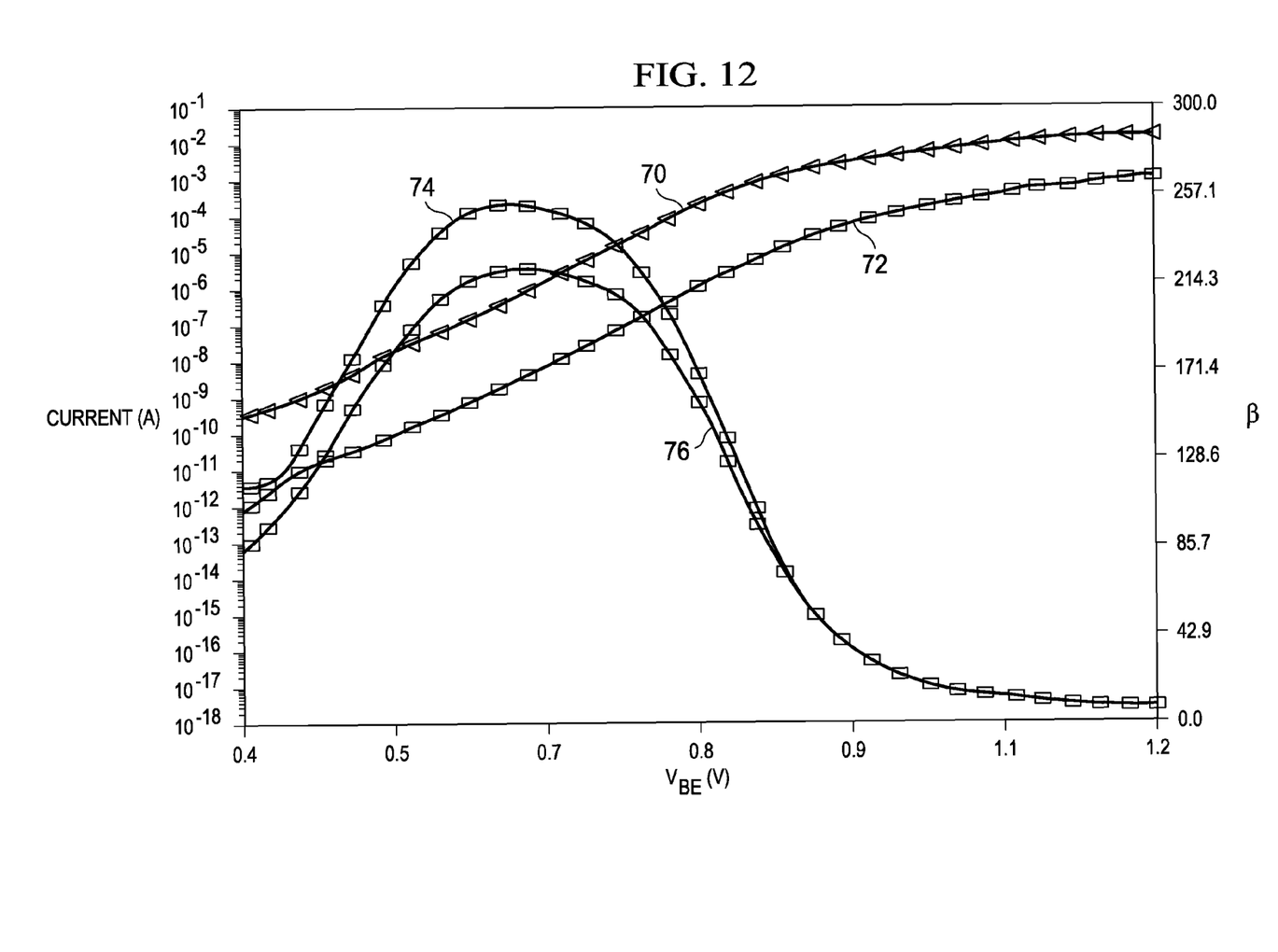
FIGS. 12 through 14 illustrate Gummel plots of sample devices.
Figure 13:
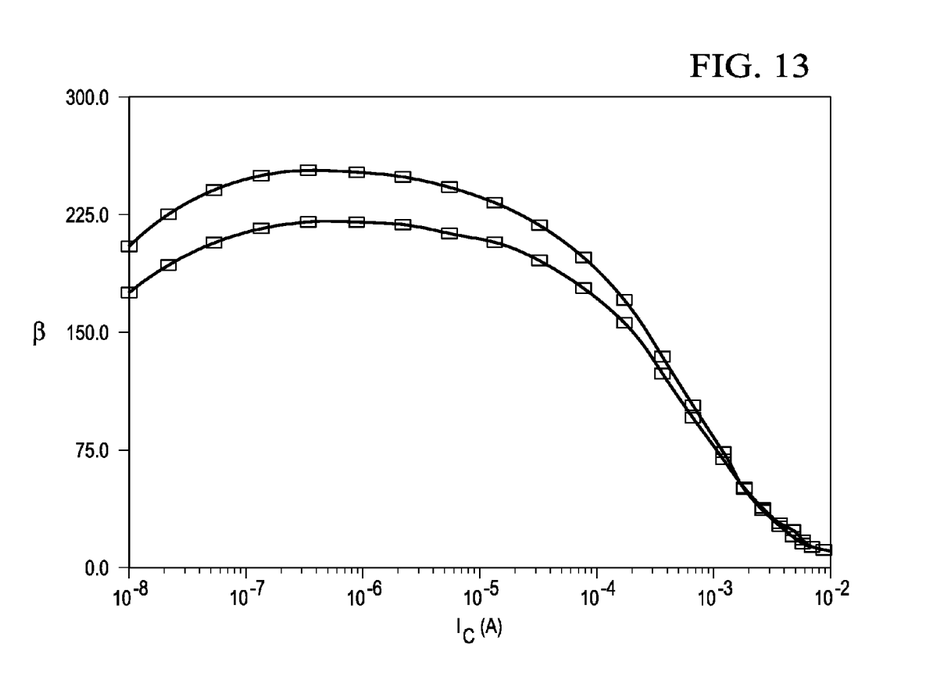

The Gummel plots of the sample LBJT devices are shown in FIGS. 12 and 13. In FIG. 12, the X-axis indicates the emitter voltages $V_{BE}$ between the base contact and the emitter. The Y-axis on the left side of the plot indicates collector currents and base currents, which are shown as lines 70 and 72, respectively. It is noted that lines 70 and 72 are substantially linear in a wide range of emitter voltages $V_E$, such as from about 0.4V to about 0.8V. The Y-axis on the right side of the plot indicates β values (corresponding to lines 74 and 76), which are the current gains and equal the collector current divided by the base current. From lines 74 and 76, it is found that the β values are high when the emitter current ranges between about 0.4V and about 0.8V. Lines 74 and 76 represent bias voltages $V_{CB}$ of 1V and 0V, respectively.

FIG. 13 illustrates the β value as a function of the collector current $I_C$. The plot shows that the β values may reach as high as 251 and remain high when the collector current $I_C$ ranges from about $10^{-8}$ A to about $10^{-4}$ A. The results shown in FIGS. 12 and 13 prove that the devices formed using the preferred embodiment of the present invention have high gains in wide current and voltage ranges.

Figure 14:
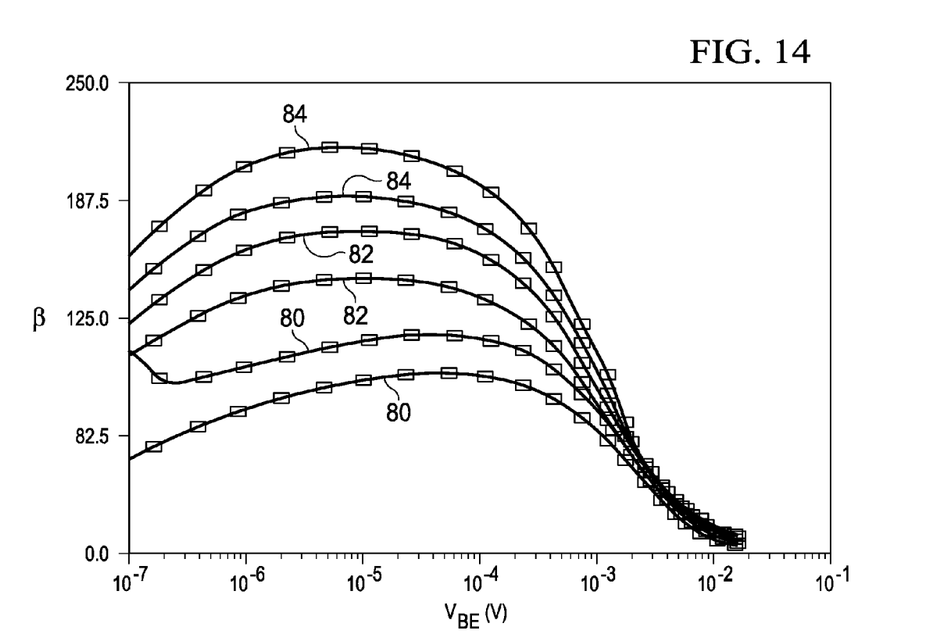

FIG. 14 illustrates a comparison of Gummel plots of three samples, wherein the X-axis and Y-axis are the same as shown in FIG. 12. Lines 80 are obtained from a first NPN BJT sample, wherein all collectors, base contacts and emitters are formed simultaneously with the formation of core CMOS devices. Pocket regions and LDD regions are formed for collectors, base contacts and emitters for the first NPN BJT sample. Lines 82 are obtained from a second NPN BJT sample, wherein no pocket regions and LDD regions are formed adjacent any of the collectors, base contacts and emitter for the second NPN BJT sample. Lines 84 are formed from a third NPN BJT sample having a structure shown in FIG. 4. It is noted that the third sample has significantly higher β values than the first and second samples.

The embodiments of the present invention have several advantageous features. The current gain and breakdown voltage of the LVBJT embodiments are improved over the conventional LVBJT devices. These improvements may be obtained without the cost of additional chip area. Further, the embodiments of the present invention do not require any additional masks.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A lateral-vertical bipolar junction transistor (LVBJT) comprising:
    a substrate;
    a well region of a first conductivity type over the substrate;
    a first dielectric over the well region;
    a first electrode over the first dielectric;
    a collector of a second conductivity type opposite the first conductivity type in the well region, wherein the collector is on a first side of the first electrode and adjacent the first electrode;
    an emitter of the second conductivity type in the well region, wherein the emitter is on a second side of the first electrode and adjacent the first electrode, wherein the second side is opposite the first side;

a base contact of the first conductivity type in the well region and adjacent the collector, wherein the collector substantially encircles the base contact on more than one side of the base contact;

a gate strip over the well region, wherein the collector and the base contact are on opposite sides of the gate strip, and wherein the collector and the base contact both contact a same portion of the well region, with the same portion being directly under the gate strip; and a collector extension region having a lower impurity concentration than the collector, wherein the collector extension region adjoins the collector, wherein the collector extension region faces the emitter, and wherein the LVBJT does not comprise any emitter extension region facing the base contact.

2. The LVBJT of claim 1, wherein the emitter is not connected to any emitter extension region.

3. The LVBJT of claim 1, wherein no pocket regions are formed in the well region and adjacent either of the collector and the emitter.

4. The LVBJT of claim 1 further comprising no collector extension region facing the base contact and adjoining the collector.

5. The LVBJT of claim 1 further comprising:
a second dielectric over the well, region and laterally between the base contact and the collector; and
a second electrode over the second dielectric, wherein the base contact and the collector have edges substantially aligned to respective edges of the second electrode.

6. The LVBJT of claim 5, wherein the second electrode is floating.

7. The LVBJT of claim 1, wherein no isolation region is laterally between the collector and the base contact and in the well region.

8. The LVBJT of claim 1, wherein the first electrode is not floating.

9. The LVBJT of claim 1 further comprising:
a plurality of collectors of the second conductivity type in the well region and interconnected to each other, wherein the plurality of collectors comprises the collector, and wherein each side of the emitter is adjacent to and parallel with a side of a respective one of the plurality of collectors; and
a plurality of base contacts of the first conductivity type in the well region and interconnected to each other, wherein the emitter does not comprise any side adjacent to and parallel with any side of any one of the plurality of base contacts.

10. The LVBJT of claim 1, wherein the collector extension region is shallower than the collector.

11. The LVBJT of claim 1, wherein the collector extension region is deeper than the collector.

12. A lateral-vertical bipolar junction transistor (LVBJT) comprising:
a substrate;
a well region of a first conductivity type over the substrate;
at least one emitter of a second conductivity type opposite the first conductivity type in the well region and interconnected to each other;
a plurality of collectors of the second conductivity type in the well region, wherein the plurality of collectors is interconnected to each other;
a plurality of base contacts of the first conductivity type in the well region, wherein the plurality of base contacts is interconnected to each other, wherein the plurality of base and the plurality of collectors are separated from each other by the well region, wherein each of the at least one emitter is surrounded by more than one of the plurality of collectors, and wherein none of the base contacts comprise a side adjacent to and substantially parallel with any side of the at least one emitter; and
a plurality of collector extension regions of the second conductivity type in the well region and adjoining the plurality of collectors, wherein the plurality of collector extension regions faces the at least one emitter, and wherein the LVBJT comprises no emitter extension region adjoining the at least one emitter and facing the plurality of collectors.

13. The LVBJT of claim 12 further comprising no emitter extension region adjoining the emitter and in directions not facing the plurality of collectors.

14. The LVBJT of claim 12, wherein no pocket regions are formed in the well region and adjacent the plurality of collectors and the at least one emitter.

15. The LVBJT of claim 12 further comprising:
a first plurality of gate strips over the well region, wherein each of the first plurality of gate strips is adjacent to and laterally between one of the at least one emitter and one of the plurality of collectors, and wherein the first plurality of gate strips is not floating; and
a second plurality of gate strips over the well region, wherein each of the second plurality of gate strips is adjacent to and laterally between one of the plurality of base contacts and one of the plurality of collectors, and wherein the second plurality of gate strips is floating.

16. The LVBJT of claim 13, wherein the first conductivity type is n-type and the second conductivity type is p-type.

17. The LVBJT of claim 13, wherein the first conductivity type is p-type and the second conductivity type is n-type.

* * * * *